United States Patent [19]

Glasheen

[11] Patent Number: 4,818,080
[45] Date of Patent: Apr. 4, 1989

[54] MONOLITHIC FARADAY OPTICAL SWITCH

[75] Inventor: William M. Glasheen, Derry, N.H.

[73] Assignee: General Electric Company, Schenectady, N.Y.

[21] Appl. No.: 117,174

[22] Filed: Nov. 5, 1987

[51] Int. Cl.$^4$ .............................................. G02F 1/09
[52] U.S. Cl. .................................. 350/355; 350/377; 350/376
[58] Field of Search .............................. 350/375–380, 350/355

[56] References Cited

U.S. PATENT DOCUMENTS 4,581,579 4/1986 Nagatsuma et al. ................. 350/375
4,735,489 4/1988 Tolksdorf et al. ................... 350/375

OTHER PUBLICATIONS

Lin, B. J., "Bright and Versitile Magnetic Bubble Display Screen", *IBM Technical Disclosure Bulletin*, vol. 16, No. 11, Apr. 1979, pp. 3795–3796.
Lin et al., "Magnetic Bubble Domain Interactive Screen", *IBM Tech. Disclosure Bulletin*, vol. 17, No. 11, Apr. 1975, pp. 3489–3491.

*Primary Examiner*—Eugene R. LaRoche
*Assistant Examiner*—Nathan W. McCutcheon
*Attorney, Agent, or Firm*—I. D. Blumenfeld

[57] ABSTRACT

A monolithic optical switch has one or more Faraday effect polarization rotation layers of bismuth doped gadolinium deposited on opposite sides of an optically inactive substrate. A non-magnetic reflecting surface is deposited on one side of the substrate over the rotator layer. A polarizing pair (crossed polarizer and analyzer elements) is deposited in a side-by-side arrangement over the Faraday rotator layer on the other side of the substrate. Plane polarized light from an optical fiber passes through the polarizer element, the rotator layer(s) and the substrate to the reflecting surface and is reflected back to the analyzer element on the other side. The presence of a magnetic field results in the rotation of the plane of polarization of the light so that passage of the reflected light through the analyzer to an output optical fiber depends on the presence or absence of the magnetic field.

6 Claims, 1 Drawing Sheet

MONOLITHIC FARADAY OPTICAL SWITCH

SUMMARY OF THE INVENTION

This invention relates to a Faraday effect optical switch. More particularly, it relates to an optical switch in which polarizing elements and the Faraday rotators are deposited on a single substrate to form a monolithic switch structure.

BACKGROUND OF THE INVENTION

Magnetically controlled optical switches which depend on the Faraday effect are known. That is, the rotation of the plane of polarization of incident linearly plane polarized radiation as it passes through certain materials in a direction parallel to an applied magnetic field, is used to control passage of the radiation through crossed polarizers. The Faraday effect which rotates the plane of polarization depends on the magnetic flux. The degree of rotation per unit path length is in turn proportional to the Verdet constant for any given material. The degree of rotation $\theta$ in angular minutes is given by:

$$\text{where } \theta = \lambda lH \cos \alpha \quad (1)$$

$r$ = the Verdet constant for the material;
$l$ = the length inch of the light path parallel to the magnetic field;
$\alpha$ = is the angle between the direction of the magnetic field and the light ray.

Faraday rotator materials customarily used in the past, such as flint glass and quartz, for example, have very low Verdet constants; viz., +0.0420 for flint glass and +0.0172 for quartz. These Faraday rotators were, therefore, quite bulky as were the remaining components (polarizers, analyzers etc.,) of the Faraday optical switches.

With the advent of small optical fibers i.e., fibers with core diameters of 100 microns or less, operation from remote sources to remote detectors and electronics has become quite feasible. Miniaturization of the optical switching element thus becomes highly desirable and the bulky Faraday optical light switches constituted of individual polarizing elements, Faraday rotators, etc. are less useful.

A need therefore exists for a small monolithic Faraday effect optical switch in which all of the functional elements are mounted on a single substrate so that essentially all of the switching functions, polarization, Faraday rotation and analysis take place on a single substrate and in a single monolithic switch structure.

Applicant has found that a monolithic Faraday effect optical switch may be constructed by using Faraday rotating layer(s) epitaxially deposited on an optically inactive substrate. A polarizer - analyzer pair is then deposited in a side-by-side arrangement on one side of the substrate over the Faraday rotator layer. A non-magnetic reflecting surface is deposited on the other side of the substrate. Radiation from an input optical fiber is transmitted through the polarizer, element, through the Faraday rotational layer(s) and the optically inactive substrate to the reflecting surface and is reflected back to the analyzer element.

The term "optically inactive" is used in the sense that the substrate is transparent to plane polarized light and does not affect the plane of polarization. The term "radiation" is used in its broadest sense to include electromagnetic energy by in and outside of the visible spectrum.

Such a monolithic switch design with all the functional components on a single substrate is not only very small but has the further advantage that it lends itself to multiple processing, high yield fabrication techniques. That is, a wafer containing Faraday rotational layer(s) deposited on a substrate is subjected to the individual processing steps by which the individual switch elements such as polarizers, analyzers, reflectors etc. for a large number of switches are simultaneously deposited on the surface. Thereafter, the processed wafer is diced to produce a large number of switches.

It is therefore a principal objective of the invention to provide a monolithic, Faraday effect optical switch.

It is a further objective of the invention to provide a monolithic, optical switch in which all of the switch elements are mounted on a single substrate.

Another objective of the invention is to provide a monolithic optical switch which may be readily fabricated by multistep, multi element fabrication techniques for producing many switches simultaneously. Other objectives and advantages of the invention will become readily apparent as the description thereof proceeds.

BRIEF DESCRIPTION OF THE INVENTION

The various objectives and advantages of the invention are realized in an arrangement in which an optically inactive garnet substrate has Faraday rotator layers such as bismuth doped gadolinium garnet deposited on opposite sides thereof by liquid phase epitaxy. A non-magnetic reflecting surface, (of aluminum, silver, etc.) is deposited over the Faraday rotator layer on one side of the substrate. The optical polarizer assembly, preferably consisting of a crossed polarizer and analyzer elements, is then deposited in a side-by-side relation over the Faraday rotator layer on the other side of the substrate. Thus, the individual elements of an optical switch for providing all the necessary functions of an optical switch namely, polarization, rotation, and analysis are fabricated monolithically on a single substrate. A magnetic field is applied orthogonally to the surface of the optical switch and radiation from an input optical fiber is used to illuminate the polarizer element with the optical fiber being positioned at an angel $\alpha$ from the normal or orthogonal axis.

The plane polarized light from the input optical fiber passes through and exits from the polarizer element and is transmitted through the first Faraday rotator layer, the substrate and through the second Faraday rotator layer to the reflective layer on the back side of the substrate. Reflected radiation passes back through the rotator layers and the substrate and illuminates the analyzer element on the front side. Rotation of the plane of polarization depends on the presence or absence of the magnetic field so that reflected radiation passes through or is blocked by the analyzer depending on the magnetic field. Any radiation passed by the analyzer is received by an output optical fiber and transmitted to remotely located detector and signal processing electronics.

Other features and characteristics of the invention are set forth with particularity in the appended claims. The invention itself; however, together with further objectives and advantages thereof may best be understood by reference to the following description taken in conjunction with the accompanying drawings in which:

DETAILED DESCRIPTION OF THE INVENTION

Figure 1:
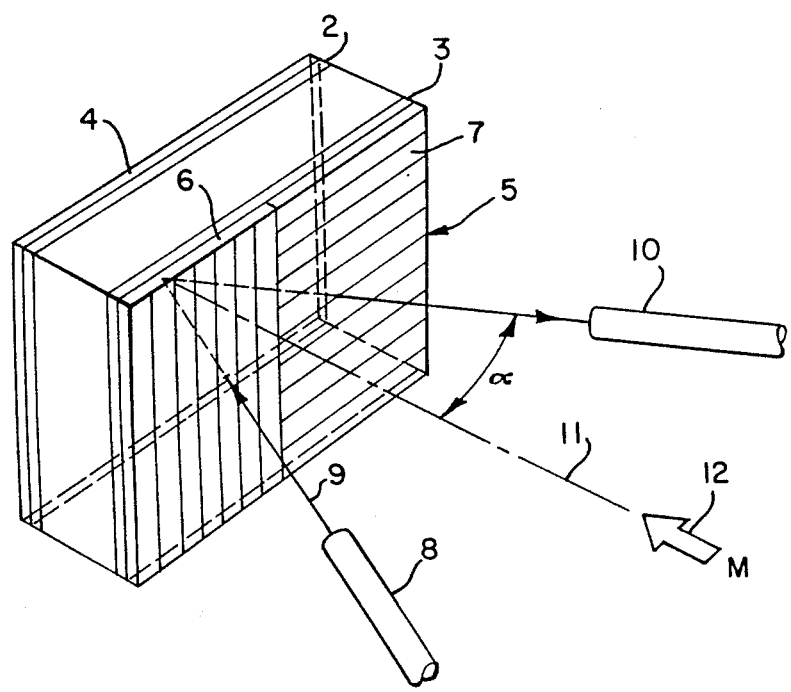
FIG. 1 is a perspective view of the monolithic Faraday optical switch element and illustrate the unique characteristics of the invention and its mode of operation.

The monolithic optical switch of FIG. 1 includes an optically inactive substrate 1. Substrate 1 is preferably a single crystal substrate of gadolinium gallium garnet although other mixed crystal garnet substrates may be used with equal effectiveness. Positioned on opposite sides of optically inactive garnet substrate 1 are Faraday rotator layers 2 and 3. Rotator layers 2 and 3 are preferably bismuth doped gadolinium garnet layers which are grown on the substrate by liquid phase epitaxy. Thus the Faraday rotator layers have the same crystalline orientation as the garnet substrate onto which it is grown; i.e., the growth of the bismuth doped gadolinium crystal structure on is oriented by the crystal structure of the garnet substrate. Bismuth doped gadolinium layers 2 and 3 are Faraday rotators in that the plane of polarization of radiant energy passing through such a layer in a direction parallel to a magnetic field is rotated by an amount dependent on the Verdet constant of the layer and the thickness of the layer. The Verdet constant of bismuth doped gadolinium Faraday rotators is extremely high. Angular rotations of one (1) ° degree per micron of thickness for magnetic field intensities of 203 Gauss for 850 nanometer light have been achieved so that 90° rotation of the incident plane polarized is possible with rotator thicknesses of roughly 90 microns. The manner in which 90 micron layers may be achieved will be described in detail below.

A non-magnetic light reflecting layer 4 (of silver or aluminum, for example) is deposited over Faraday rotator 2. The polarizing pair shown generally at 5 is deposited on the front surface of the substrate over rotator layer 3. Polarizer pair 5 preferably consists of a pair of crossed elements mounted in a side-by-side configuration to control transmission as a function of a magnetic field. That is, the polarizing pair 5 consists of a polarizer element 6 shown as a vertical polarizer which permits passage of vertically plane polarized light whereas analyzer 7 positioned adjacent to polarizer 6 is oriented to permit passage of horizontally polarized light. The polarizer elements in the side-by-side configuration are deposited over rotator layer 3 by well-known deposition techniques.

The Faraday optical switch is illuminated by radiant energy from an input optical fiber 8. Input fiber 8 transmits radiation from a remote source, and its associated optics such as collimators etc. Input fiber 8 is typically a 100 micron core diameter optical fiber with the customary reflective and cladding layers, etc. Input fiber 8 is positioned to illuminate polarizer element 6 with the radiation illustrated by the arrow 9. Input light fiber 8 as well as the output light fiber 10 positioned adjacent to analyzer 7 by an angle α from the normal or orthogonal axis 11, which represent the axis of the applied magnetic field 12.

Vertically plane polarized light 9 exiting from polarizer 6 passes through Faraday rotater layer 3, and thence through substrate 1 to Faraday layer 2. The light is reflected from layer 4 back through the rotator layers and the substrate to analyzer 7. Plane polarized radiation which is rotated by 90° as shown by the arrow 9, passes through analyzer 7 to output fiber 10 and is transmitted to remotely located detectors and signal processing electronics to produce an output signal which is an indication of the condition represented by the presence of the magnetic field.

If the degree of rotation is less that 90° only a portion of the incident radiation is horizontally polarized and only a portion of the incident radiation passes through analyzer 7. That is, in the absence of the magnetic field the plane of polarization is not rotated so that crossed analyzer 7 blocks all of the incident radiation. In the presence of a magnetic field, the incident radiation is rotated by an amount approaching 90° so that some of the radiation illuminating the back of analyzer 7 is now horizontally polarized and all or a substantial portion of the incident radiation passes through the analyzer and is received by the output optical fiber 10.

In the arrangement of FIG. 1 the magnetic field 12 is shown as normal to the surface of the polarizing pair. It will be obvious, that the non-magnetic reflecting surface 4 on the backside of the substrate can be positioned next to the magnetic field. That is, since reflecting surface is non-magnetic a magnetic field can penetrate reflecting layer 4 from the rear and pass through Faraday rotator layers 2 and 3.

Optically inactive single crystal substrates of gadolinium galium garnet having Faraday rotator layers of bismuth doped gadolinium are available from various sources, as for example, from the Airtron Division of Litton Industries located at 200 E. Hanover Avenue, Morris Plains, N.J. 07950 under its trade designation LLC 120. The Single crystal substrate/rotator is approximately 0.5 milimeters thick and consists of an optically inactive gadolinium. gallium garnet substrate having 21.7 micron thick layers of the bismuth doped gadolinium on each surface.

The actual composition of LLC 120 is:

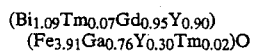

$(Bi_{1.09}Tm_{0.07}Gd_{0.95}Y_{0.90})$
$(Fe_{3.91}Ga_{0.76}Y_{0.30}Tm_{0.02})O$

The rotator layers, for a magnetic field of 203 Gauss produce a Faraday rotation of 1.4° per micron for light at 632 nanometers and 3.6° per micron at 546 nanometers. For a Faraday rotater thickness layer of 21.7 microns incoming vertically polarized energy passes through each rotator layer twice, once directly, and again after being reflected by reflecting surface 4. Thus, it passes through a total Faraday rotator thickness of 86.8 microns; i.e., resulting in a rotation in excess of 90°. An LLC 120 polarization rotator was tested at 850 nanometers and each rotator layer produced a rotation of 1° per micron. Thus, in passing through the 21.7 layers four 4 times the vertically polarized incident energy is rotated by 87° so that virtually all of it passes through analyzer 7. Obviously, by adjusting the thicknesses of the Faraday rotator layers, for any offset angle α. 90° rotation of the polarized light may be readily achieved. The crossed polarizer pair 5 on the substrate may take a variety of forms, as for example, dichroic polarizers of well known composition. Alternatively, the crossed polarizer elements may be metallic thin film devices of the Herzian type; i.e., an array or grid of parallel metal elements separated by a distance less the wave length of the incident radiation with the metallic elements reflecting the incident light of the wave length being polarized—At the light wave lengths being discussed; viz, 500–900 nanometers; the spacing ranges from just under one (1) micron to about two (2) microns. High vacuum evaporation techniques are used to deposit the array of this parallel metallic layers or whickers.

One manner of producing the array is to cover the surface of the substrate/rotator with an optical resist. The resist is exposed through a mask having the desired grid spacing. The resist is then subjected to a suitable solvent, thereby removing the resist under the unexposed strips to deposit metal on the surface of the substrate/rotator where the unexposed resist has been removed to form the array or grid of parallel metal elements. The hardened resist is then removed by another solvent leaving a grid of parallel uncovered strips on the rotator layer. Polarized light passes through the spaces between the array of metallic strips and is projected through the rotator layer to the substrate. The size of the switch element may be a square as small as two millimeters on a side. The substrate with the 21.7 $\mu$ rotator layers on each side is about 0.5 millimeters thick. The reflecting layer is about 20–50 microns thick and the polarizer pair about 50 microns so that the overall is approximately 0.6 millimeters. Substrates with epitaxial Faraday rotator layers on each side are available in 75 millimeter diameter sizes. Therefore, hundreds of two millimiter by two millimeter optical switch element, with one millimeter spacing can be simultaneously processed to form the final assembly. The processed wafer is then diced to produce the individual Faraday effect optical switch elements.

In FIG. 1 the crossed polarizer element 5 and 6 are shown in a horizontal side by side arrangement and the input and output fibers are horizontally offset from the axis normal to surface by an angle $\alpha$. It is obvious that the crossed polarizers may be positioned one above the other in which case the fibers are positioned so as to be vertically offset from the normal axis by an angle $\alpha$.

The invention has also been described and shown with a crossed polarizer pair, so that in the absence of the magnetic field light is blocked by the analyzer. Only when the magnetic field is present is the incident polarized light rotated in the Faraday rotator layer(s) to produce light output from the switch which intercepted and transmitted by the output fiber to a detector. Obviously, the polarizers need not be crossed but can be parallel so that light is passed through the analyzer in the absence of a magnetic field and is blocked when the magnetic field is present and rotates the plane of polarization of the incident light. Thus, the detectors have an output in the absence of the field and the output goes to zero or a low value when the magnetic field is present. Such an arrangement would involve changes in the remote signal processing electronics associated with the detectors but is perfectly feasible. The input and output fibers are shown spaced from the surface of the switch. It is equally possible to position the fibers in direct contact with the surface and may, in fact improve operation.

It will be seen therefore, that the invention provides an integrated Faraday effect optical switch of monolithic construction and of very small size. Furthermore, the individual switch elements which provide the necessary switch functions; viz, polarization, rotation, analysis, etc., are located on a single substrate. A large number of switches may be fabricated simultaneously using multiple processing, high yield wafer fabrication techniques thereby making very small, low cost optical switches possible.

While the instant invention has been described in connection with a preferred embodiment thereof, the invention itself is by no means limited thereto since many modifications in the instrumentalities employed may be made without departing from the true spirit and scope of the invention.

What is claimed as the invention and desired to be secured by U.S. Letters Patent is:

1. A monolithic Faraday effect optical switch comprising:
    (a) an optical switching element including a radiation transmitting substrate having at least the following elements:
        (1) at least one (1) Faraday effect polarization rotator means on said substrate;
        (2) polarizing means including polarizer and analyzer elements deposited on one side of said substrate to control passage of radiation;
        (3) radiation reflecting means deposited on the other side of said substrate to reflect radiation passing through said substrate
    (b) radiation transmitting and receiving means positioned adjacent to said switching element on said one side of said substrate, said transmitting means positioned to irradiate said polarizing means whereby incident radiation from said transmitting means passes through said polarizer element and thence through said Faraday rotator means and said substrate to said reflecting element and back to said analyzer element;
    (c) a magnetic field Positioned in flux relationship with said switch, said magnetic field passing through said Faraday effect rotator means to vary the polarization of the incident polarized radiation whereby passage of incident radiation through said switch and said analyzer element to said receiving means is controlled by the presence or absence of a magnetic field.

2. The monolithic Faraday effect optical switch according to claim 1 wherein said polarizer and analyzer elements comprising said polarizing means are deposited in a side-by-side arrangement on one side of said substrate.

3. The monolithic Faraday optical switch according to claim 1
    wherein said Faraday polarization rotator is an epitaxial
    crystal layer.

4. The monolithic Faraday effect optical switch according to claim 3 wherein the Faraday rotator is an epitaxial bismuth doped gadolinium layer.

5. The monolithic Faraday effect optical switch according to claim 1 wherein said radiation transmitting and receiving means comprises individual optical fibers angularly offset from the magnetic field axis.

6. The monolithic Faraday effect optical switch according to claim 1 wherein Faraday effect polarization rotator means are deposited on both sides of said substrate.

* * * * *